(12) United States Patent
Zhu

(10) Patent No.: US 12,207,422 B2
(45) Date of Patent: Jan. 21, 2025

(54) DISPLAY DEVICE

(71) Applicant: Beijing Xiaomi Mobile Software Co., Ltd., Beijing (CN)

(72) Inventor: Jianxin Zhu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 185 days.

(21) Appl. No.: 17/971,793

(22) Filed: Oct. 24, 2022

(65) Prior Publication Data

US 2023/0422414 A1    Dec. 28, 2023

(30) Foreign Application Priority Data

Jun. 22, 2022    (CN) .......................... 202221578334.3

(51) Int. Cl.
| | | |
|---|---|---|
| *H05K 5/00* | (2006.01) | |
| *H05K 5/02* | (2006.01) | |
| *H05K 5/03* | (2006.01) | |
| *H05K 5/06* | (2006.01) | |

(52) U.S. Cl.
CPC ............. *H05K 5/0214* (2022.08); *H05K 5/03* (2013.01); *H05K 5/062* (2013.01)

(58) Field of Classification Search
CPC ...... H05K 5/0017; H05K 5/0217; H05K 5/03; H05K 5/0214; H05K 5/062
USPC ................................ 361/807, 728, 809, 810
See application file for complete search history.

(56) References Cited

U.S. PATENT DOCUMENTS

| | | |
|---|---|---|
| 2017/0099742 A1 | 4/2017 | Choi et al. |
| 2018/0098446 A1 | 4/2018 | Choi et al. |
| 2018/0249588 A1 | 8/2018 | Choi et al. |
| 2019/0245958 A1* | 8/2019 | Cheng .................. G06F 1/1656 |
| 2019/0335027 A1 | 10/2019 | Cheng |
| 2019/0343013 A1 | 11/2019 | Choi et al. |
| 2020/0007669 A1 | 1/2020 | Kwon |
| 2022/0078937 A1 | 3/2022 | Choi et al. |

FOREIGN PATENT DOCUMENTS

| | | | | |
|---|---|---|---|---|
| CN | 206004862 U | * | 3/2017 | ............... H04R 1/08 |
| CN | 209327753 U |   | 8/2019 | |
| CN | 114624845 A | * | 6/2022 | ............. G02B 13/36 |
| CN | 114513590 B | * | 12/2023 | ............. G03B 17/08 |

OTHER PUBLICATIONS

Extended European Search Report issued Jun. 2, 2023 in European Patent Application No. 22204680.7, 9 pages.

* cited by examiner

*Primary Examiner* — Hung S. Bui
(74) *Attorney, Agent, or Firm* — Oblon, McClelland, Maier & Neustadt, L.L.P.

(57) ABSTRACT

A display device, includes: a housing including a first opening; a display component mounted on the housing and including a second opening aligned with the first opening, the first opening and the second opening being used for a camera of the display device to collect ambient light; a first dust-proof part located between the display component and the housing; where, a surface of the housing toward the first dust-proof part is recessed inwardly to form an accommodating groove used for accommodating the first dust-proof part.

19 Claims, 5 Drawing Sheets

DISPLAY DEVICE

CROSS-REFERENCE TO RELATED APPLICATIONS

The present disclosure is based on Chinese Patent Application No. 202221578334.3 filed on Jun. 22, 2022, and claims priority to the Chinese Patent Application, the entire contents of which are incorporated herein by reference.

BACKGROUND OF THE INVENTION

Field of the Invention

The present disclosure relates to the field of display, in particular to a display device.

Description of the Related Art

With the continuous development of electronic technology, mobile phones, handheld computers and other display devices have become the most common communication tools in people's daily life.

At present, most display devices are equipped with cameras. In order to protect the camera lens from external dust pollution, compressed foam is generally set in the gap between the camera and the housing of the display device and the gap between the screen and the housing to prevent dust.

SUMMARY OF THE INVENTION

According to some embodiments of the present disclosure, there is provided a display device including at least a housing including a first opening, a display component, mounted on the housing and including a second opening aligned with the first opening, where the first opening and the second opening are used for a camera of the display device to collect ambient light. The display device can further include a first dust-proof part, located between the display component and the housing, where, a surface of the housing toward the first dust-proof part is recessed inwardly to form an accommodating groove used for accommodating the first dust-proof part.

BRIEF DESCRIPTION OF THE DRAWINGS

The drawings here are incorporated into the description and form a part of the description, showing embodiments consistent with the present disclosure, and are used together with the description to explain the principle of the present disclosure.

DETAILED DESCRIPTION OF THE PREFERRED EMBODIMENTS

Figure 1A:
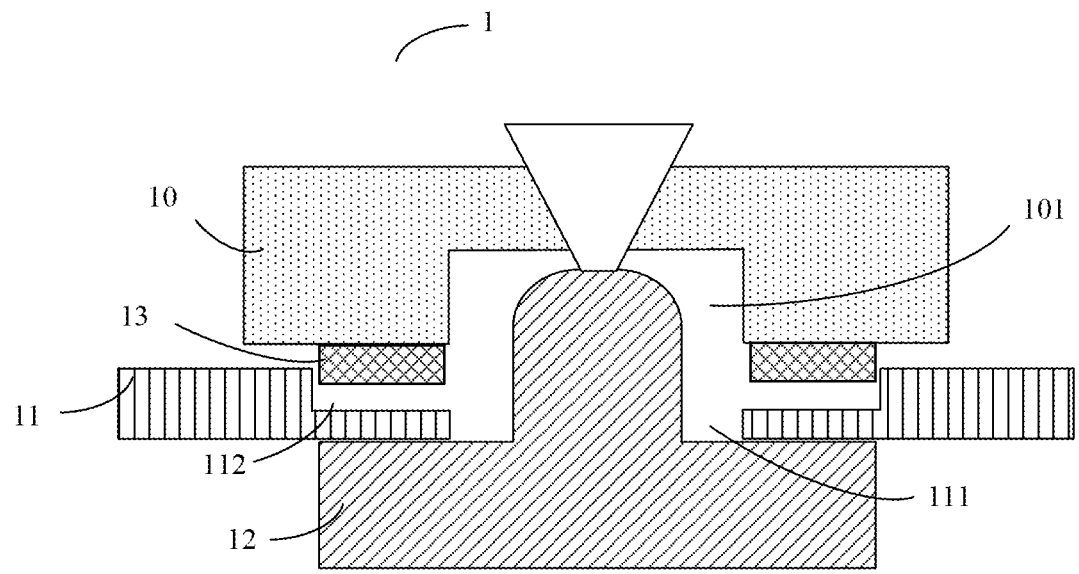
FIG. 1a is a schematic structural diagram of a display device according to an embodiment of the present disclosure.

Here, embodiments will be described in detail, and examples are shown in the drawings. When the following description refers to the drawings, unless otherwise indicated, the same numbers in different drawings refer to the same or similar elements. The embodiments described in the following embodiments do not represent all embodiments consistent with the present invention. Instead, they are examples of structures consistent with some aspects of the present invention as detailed in the appended claims.

In the description of the present disclosure, it should be understood that the orientation or positional relationship indicated by the terms "center", "longitudinal", "transverse", "length", "width", "thickness", "upper", "lower", "front", "rear", "left", "right", "vertical", "horizontal", "top". "bottom", "inner", "outer". "clockwise", "counter clockwise", "axial", "radial", "circumferential direction" and the like, is based on the orientation or positional relationship shown in the attached drawings. It is for the convenience of describing the present disclosure and simplifying the description, and does not indicate or imply that the device or element referred to should have a specific orientation, be constructed and operated in a specific orientation. Therefore, it cannot be understood as a limitation to the present disclosure.

In the description of the present disclosure, it should be noted that, unless otherwise specified and defined, the terms "installation", "to be connected" and "connection" should be understood in a broad sense. For example, it may be a fixed connection, a detachable connection, or an integrated connection; it may be a mechanical connection or an electrical connection; it can be a direct connection, or an indirect connection through an intermediate medium, or it may be a communication between two elements. For those of ordinary skill in the art, the specific meaning of the above terms in the present disclosure can be understood in specific circumstances.

When the compressed foam between the screen and the housing is compressed, the rebound force of the compressed foam will squeeze the screen, and it is easy to cause pressing water ripples at the corresponding positions of the screen. In order to overcome the problems existing in the related art, the present disclosure provides a display device.

The technical solutions provided by various embodiments of the present disclosure will be described in detail below in combination with the accompanying drawings.

FIG. 1a is a schematic structural diagram of a display device according to an embodiment of the present disclosure. As shown in FIG. 1a, the display device 1 may include a housing 11 including a first opening 111, and a display component 10 mounted on the housing 11 and including a second opening 101 aligned with the first opening 111, where the first opening 111 and the second opening 101 are used for the camera 12 of the display device 1 to collect ambient light. The display can further include a first dust-proof part 13 located between the display component 10 and the housing 11, where, a surface of the housing 11 toward the first dust-proof part 13 is recessed inwardly to form an accommodating groove 112 for accommodating the first dust-proof part 13.

In some embodiments, the display device 1 may be any device including a camera, such as a mobile phone, a tablet personal computer, a personal digital assistant (PDA), a mobile Internet device (MID), a wearable device, and the like. The display component 10 may be a display screen of the display device 1. The housing 11 may be a component supporting the display component 10 in the display device 1.

Here, the support strength of the housing 11 is greater than a preset strength, so that the housing 11 can better support the display component 10.

As shown in FIG. 1a, the housing 11 and the display component 10 may respectively include a first opening 111 and a second opening 101 aligned with each other. The first opening 111 on the housing 11 may be a through hole penetrating the thickness direction of the housing 11, and the second opening 101 on the display component 10 may be a blind hole not penetrating the thickness direction of the display component 10, thereby forming a closed structure covering the camera 12. The camera 12 of the display device 1 may be partially accommodated in the first opening 111 and the second opening 101 to collect ambient light through the first opening 111 and the second opening 101, thereby realizing the imaging function of the display device 1.

It is understood that the first dust-proof part 13 may be an elastic part. For example, the first dust-proof part 13 may be a dust-proof foam. When the foam is in a compressed state, its compression rate can reach 50%.

In some embodiments, the first dust-proof part 13 may be an annular structure. As shown in FIG. 1a, the first dust-proof part 13 can be adhered to the display component 10.

Here, the surface of the first dust-proof part 13 toward the display component 10 is adhered to the display component 10. That is, when the display component 10 is mounted on the housing 11, the first dust-proof part 13 can be accommodated in the above-mentioned accommodating groove 112 following the display component 10.

It should be understood that the above-mentioned accommodating groove 112 may be a groove of various shapes as long as it can be used to accommodate the first dust-proof part 13, and is not limited in the embodiments of the present disclosure.

Here, the shape of the accommodating groove 112 may match the shape of the first dust-proof part 13. For example, when the cross-section of the first dust-proof part 13 in the direction of the housing 11 toward the first opening 111 is rectangular, the cross-section of the accommodating groove 112 in the direction of the housing 11 toward the first opening 111 may also be rectangular. Alternatively, when the cross-section of the first dust-proof part 13 in the direction of the housing 11 toward the first opening 111 is fan-shaped, the cross-section of the accommodating groove 112 in the direction of the housing 11 toward the first opening 111 may also be fan-shaped, and so on.

Figure 1B:
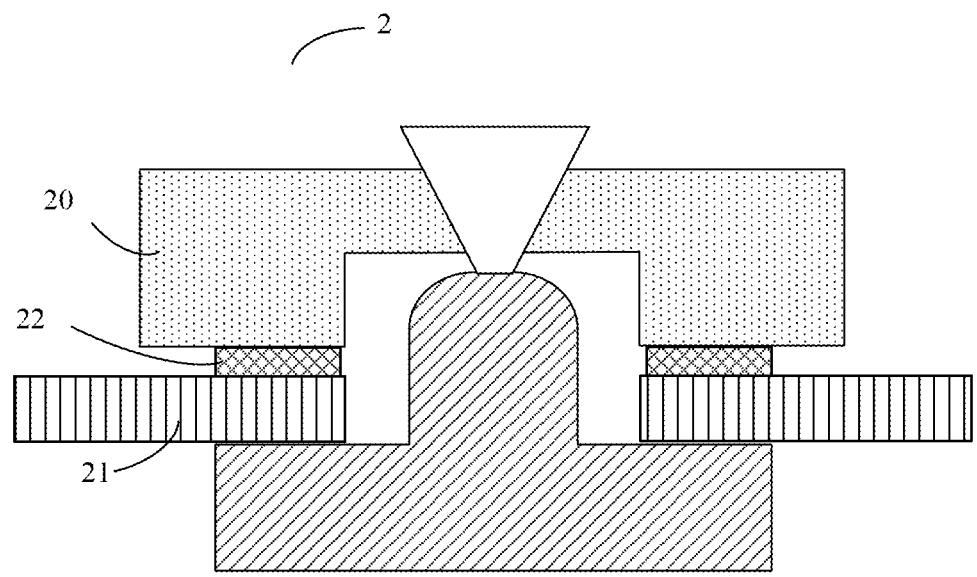
FIG. 1b is a schematic structural diagram of a conventional display device.

For example, as shown in FIG. 1b, the third dust-proof part 22 of the conventional display device 2 is located between the front housing 21 of the conventional display device 2 and the display screen 20, and the third dust-proof part 22 is adhered to the front housing 21. At the same time, the front housing 21 of the conventional display device 2 is not provided with an accommodating groove, so that the third dust-proof pan 22 is in a compressed state when the display screen 20 is mounted on the front housing 21. At this time, the reverse force of the rebound of the third dust-proof part 22 will squeeze the display screen 20, and it is easy to cause pressing water ripples at the corresponding positions of the display screen 20.

Based on this, the present disclosure provides a display device, which includes a housing with a first opening, a display component mounted on the housing and including a second opening aligned with the first opening, where the first opening and the second opening are used for the camera of the display device to collect ambient light. The display device can further include a first dust-proof part located between the display component and the housing; where the surface of the housing toward the first dust-proof part is recessed inwardly to form an accommodating groove used for accommodating the first dust-proof part. Thus, by accommodating the first dust-proof part in the accommodating groove, it is possible to reduce the situation that the first dust-proof part is pressed by the display component when the housing supports the display component, reduce the reverse force acting on the display component due to the pressing of the first dust-proof part, and further reduce the pressing water ripples generated by the display component.

In some embodiments, as shown in FIG. 1a, the thickness of the first dust-proof part 13 may be less than or equal to the depth of the accommodating groove 112.

It can be understood that when the thickness of the first dust-proof part 13 is less than the depth of the accommodating groove 112 and the display component 10 is mounted on the housing 11, the first dust-proof part 13 can be completely accommodated in the accommodating groove 112 of the housing 11 following the display component 10. At this time, there is a gap between the surface of the first dust-proof part 13 toward the accommodating groove 112 and the bottom surface of the accommodating groove 112. That is, there is no contact between the two. Therefore, the first dust-proof part 13 is in a natural state, that is, a state in which it is not compressed. When the thickness of the first dust-proof part 13 is equal to the depth of the accommodating groove 112 and the display component 10 is mounted on the housing 11, the first dust-proof part 13 may also be completely accommodated in the accommodating groove 112 of the housing 11 following with the display component 10. At this time, the surface of the first dust-proof part 13 toward the accommodating groove 112 is in contact with the bottom surface of the accommodating groove 112, but the first dust-proof part 13 has not yet been subjected to the force applied by the display component 10, and therefore, the first dust-proof part 13 is still in a state in which it is not compressed.

As described above, when the display component 10 is mounted on the housing 11, the first dust-proof part 13 can be accommodated in the accommodating groove 112 in a natural state, that is, in a state in which it is not compressed, so that the display component 10 will not be subjected to the reverse force of the first dust-proof part 13, and thus the display component 10 will not generate pressing water ripples.

Figure 2:
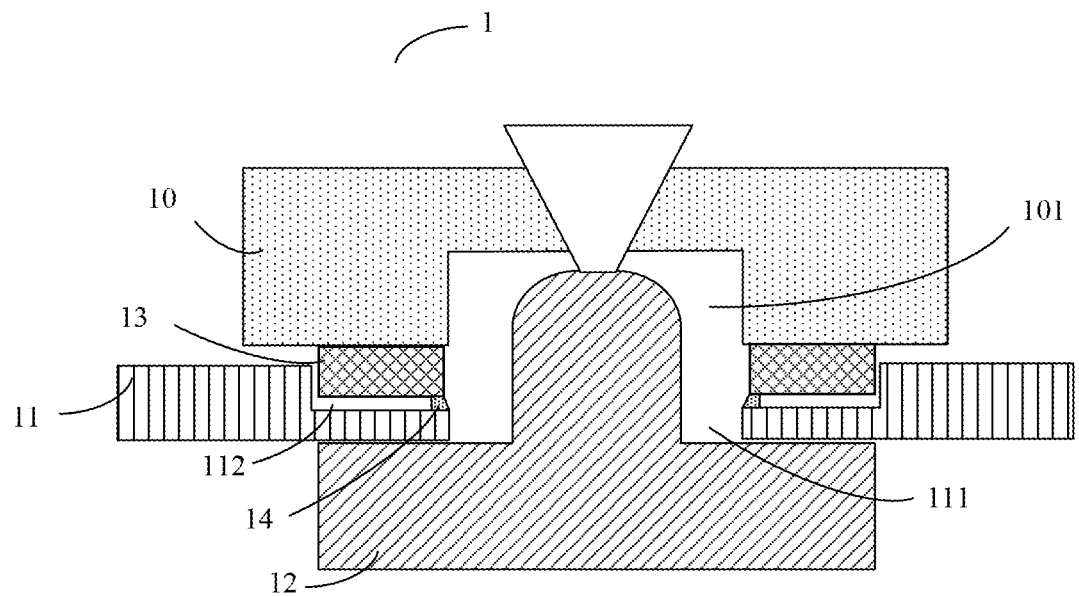
FIG. 2 is a schematic structural diagram of a display device according to an embodiment of the present disclosure.

FIG. 2 is a schematic structural diagram of a display device according to an embodiment of the present disclosure. As shown in FIG. 2, according to some embodiments of the present disclosure, the display device further includes other components, such as a sealant, on the basis of the display device shown in FIG. 1.

As shown in FIG. 2, the display device 1 provided in some embodiments of the present disclosure may further include a sealant 14, which is located between the first dust-proof part 13 and the housing 11, and is used to seal the gap between the first dust-proof part 13 and the housing 11.

The sealant 14 may be a sealing material that can be deformed according to the shape of the sealing surface, is not easy to flow, and has certain adhesiveness. The sealant 14 can be used to fill the gap between the first dust-proof part 13 and the housing 11 to play a sealing role.

In some embodiments, the length of the sealant 14 in the direction of the housing 11 toward the first opening 111 may range from 0.5 mm to 1 mm. Thus, the sealing between the first dust-proof part and the housing can be better ensured.

The present disclosure provides a display device, in which the gap between the first dust-proof part and the housing can be sealed by setting a sealant on the basis of setting a first dust-proof part between the display component and the housing, so as to further ensure that the gap between the display component and the housing will not be filled with dust. At the same time, the first dust-proof part can be accommodated in the accommodating groove, which can reduce the situation that the first dust-proof part is pressed by the display component when the housing supports the display component, reduce the reverse force acting on the display component due to the pressing of the first dust-proof part, and further reduce the pressing water ripples generated by the display component.

In some embodiments of the present disclosure, while the accommodating groove 112 is a groove of various shapes, the sealant 14 may also be located at different positions.

A specific implementation example is given below. It should be noted that the following list is an example and is not intended to be limiting.

Figure 3:
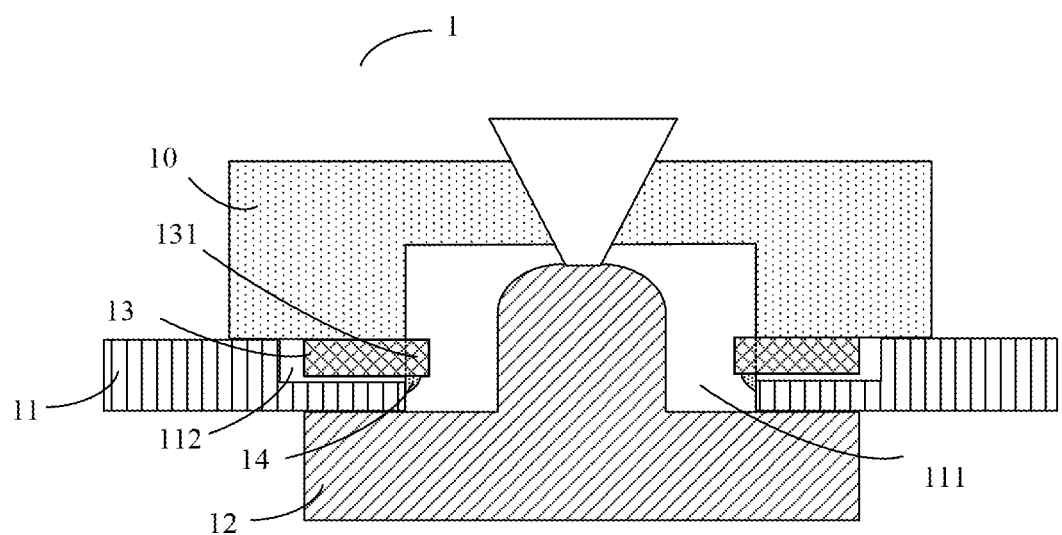
FIG. 3 is a schematic structural diagram of a display device according to an embodiment of the present disclosure.

In some embodiments, as shown in FIG. 3, the display device 1 provided in some embodiments of the present disclosure may include a display component 10, a housing 11, a camera 12, a first dust-proof part 13 and a sealant 14.

The accommodating groove 112 may communicate with the first opening 111. The first dust-proof part 13 may include an extension portion 131 extending toward the first opening 111 and located outside the accommodating groove 112. The sealant 14 may be located in the space enclosed by the extension portion 131 and the housing 11, and connect the surface of the extension portion 131 toward the first opening 111 and the inner wall of the first opening 111.

It can be understood that, as shown in FIG. 3, the accommodating groove 112 may be provided at the first opening 111 to communicate with the first opening 111. Since the thickness of the first dust-proof part 13 is less than or equal to the depth of the accommodating groove 112, the gap between the first dust-proof part 13 and the accommodating groove 112 can be connected by the sealant 14.

It should be understood that the length of the first dust-proof part 13 in the direction of the housing 11 toward the first opening 111 can be set according to the actual application, and is not limited here. For example, as shown in FIG. 3, the first dust-proof part 13 may partially exceed the accommodating groove 112. Alternatively, the first dust-proof part 13 may be completely accommodated in the accommodating groove 112.

The sealant 14 may be a hot melt adhesive when the accommodating groove 112 communicates with the first opening 111. Among them, the hot melt adhesive is a kind of plastic adhesive. Within a certain temperature range, its physical state changes with the change of temperature, while its chemical properties remain unchanged. It is non-toxic and tasteless, and is an environmentally friendly chemical product. In this way, the surface of the extension portion toward the first opening and the inner wall of the first opening can be connected more quickly and firmly.

In some embodiments, when the sealant 14 is a hot-melt adhesive, the adhesive gun can be used for dispensing, and the width range can be 0.5 mm to 1 mm. In addition, the angle range of dispensing with the adhesive gun can be 40 degrees to 50 degrees, so that the gap between the first dust-proof part and the housing can be better sealed.

Here, dispensing is a verb, that is, a process, which can also be called: sizing, coating, filling, dripping, etc. Dispensing is to smear, encapsulate and drip electronic adhesive, oil or other liquids onto the products, so that the products can play the roles of adhesion, encapsulation, insulation, fixation and smooth surface.

The present disclosure provides a display device, which can better seal the gap between the first dust-proof part and the accommodating groove with hot-melt adhesive when the accommodating groove is connected with the first opening, so that on the basis of setting the first dust-proof part between the display component and the housing, the hot-melt adhesive can further ensure that the gap between the display component and the housing will not be filled with dust.

Figure 4:
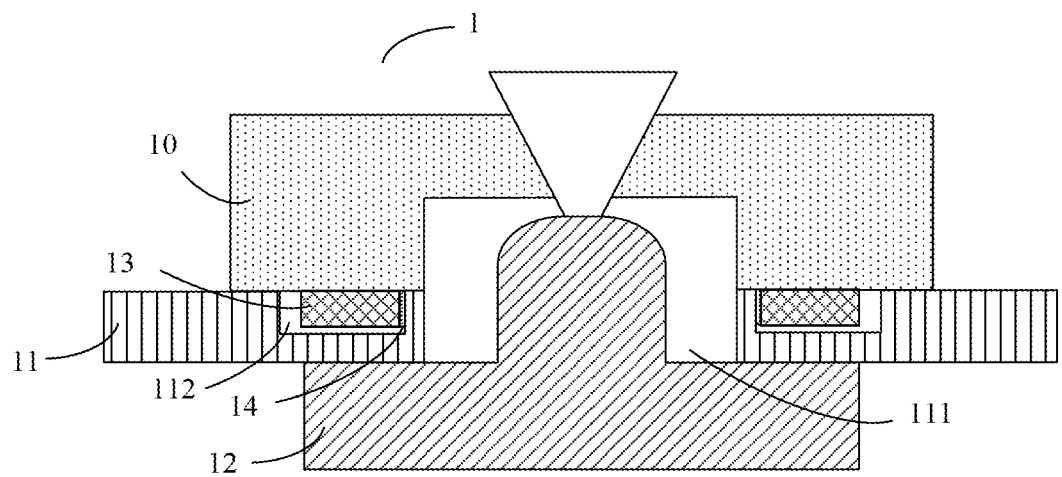
FIG. 4 is a schematic structural diagram of a display device according to an embodiment of the present disclosure.

In some embodiments, as shown in FIG. 4, the accommodating groove 112 may be spaced apart from the first opening 111. The sealant 14 may be located on the surface of the first dust-proof part 13 contacting with the accommodating groove 112.

It can be understood that the accommodating groove 112 may be a groove dug out on the housing 11 and spaced apart from the first opening 111 to accommodate the first dust-proof part. At this time, the length of the first dust-proof part 13 in the direction of the housing 11 toward the first opening 111 may be less than or equal to the width of the accommodating groove 112, so that the first dust-proof part 13 can be accommodated in the accommodating groove 112. Since the thickness of the first dust-proof part 13 is less than or equal to the depth of the accommodating groove 112, the gap between the first dust-proof part 13 and the accommodating groove 112 can be connected by the sealant 14.

It should be understood that the spacing distance between the accommodating groove 112 and the first opening Ill can be set according to the actual application, and the embodiments of the present disclosure are not limited.

When the accommodating groove 112 is spaced apart from the first opening 111, the sealant 14 may be a dispensed adhesive. Here, the dispensed adhesive is a term, referring to a fluid adhesive, which can be paste or powder. As long as it is flowing, it can be collectively referred to as the dispensed adhesive. At this time, the dispensed adhesive can be used to adhere the first dust-proof part and the accommodating groove, so that the display component and the housing can be better sealed.

The thickness of the sealant 14 can be set according to the actual application, and the embodiments of the present disclosure are not limited.

The present disclosure provides a display device, which can better adhere the first dust-proof part and the first opening with the dispensed adhesive under the condition that the accommodating groove and the first opening are spaced apart, so that on the basis of setting the first dust-proof part between the display component and the housing, it can be further ensured that the gap between the display component and the housing will not be filled with dust by the dispensed adhesive.

Figure 5:
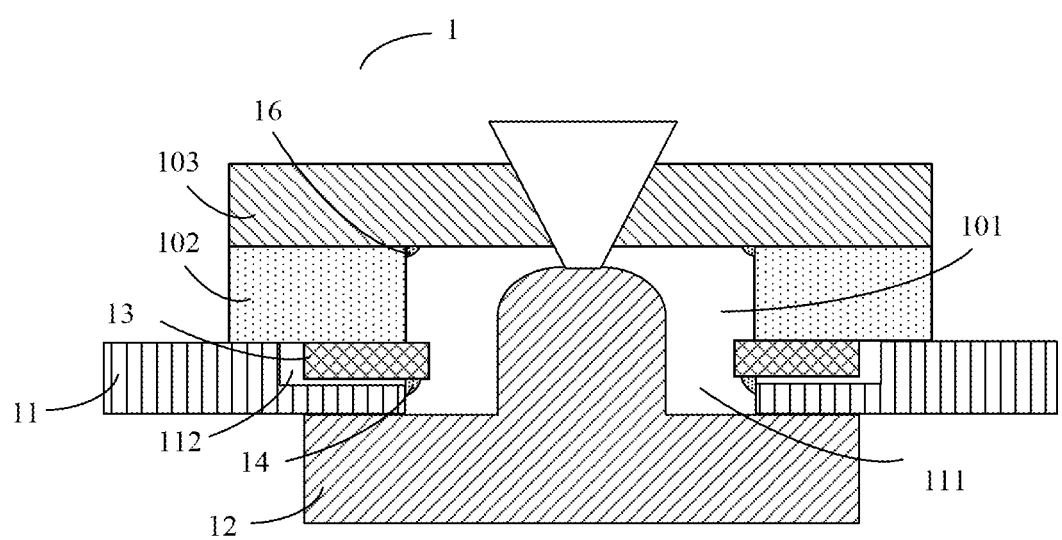
FIG. 5 is a schematic structural diagram of a display device according to an embodiment of the present disclosure.

FIG. 5 is a schematic structural diagram of a display device according to an embodiment of the present disclosure. As shown in FIG. 5, in the display device provided in the embodiment of the present disclosure, the display component 10 can be further subdivided on the basis of the display device shown in FIG. 3. For example, the display component 10 may include a backlight part 102 and a glass cover plate 103.

As shown in FIG. 5, the display device 1 provided in the embodiment of the present invention may include a housing 11, a camera 12, a backlight part 102, a glass cover plate 103, a first dust-proof part 13, a sealant 14, and a light blocking adhesive 16.

The backlight part 102 can be adhered to the glass cover plate 103 through the light blocking adhesive 16. The first dust-proof part 13 may be adhered to the backlight part 102.

It can be understood that the light blocking adhesive 16 can also be formed by dispensing with an adhesive gun, and the angle range can be 40 degrees to 50 degrees, so that the backlight part and the glass cover can be better adhered.

Here, the glass cover part 103 may be an outer screen of the display screen. The backlight part 102 may be a component responsible for lighting the display screen. Among them, backlight is a form of illumination in the electronic industry and is often used for the display of liquid crystal display (LCD). The difference between the backlight type and the front light type is that the backlight is illuminated from the side or the back, while the front light is illuminated from the front as the name implies. Both of them are used to increase the illumination in low light source environment and the brightness on computer displays and liquid crystal screens, and generate light in a similar manner to the display of cathode ray tube (CRT).

The present disclosure provides a display device, which can better adhere a backlight part and a glass cover plate by using a light blocking adhesive, so as to further ensure that no dust will enter the second opening.

Figure 6:
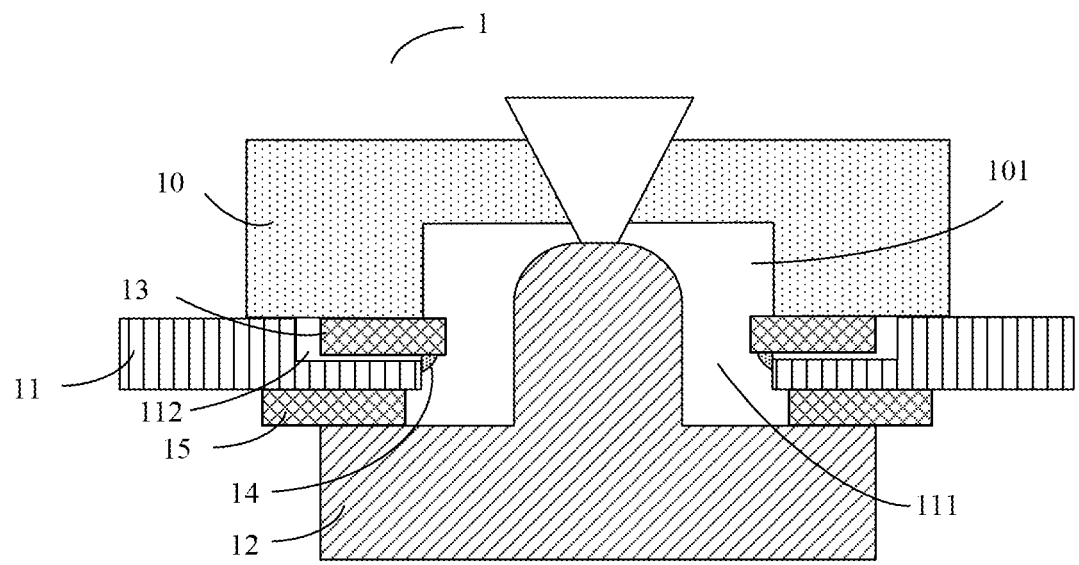
FIG. 6 is a schematic structural diagram of a display device according to an embodiment of the present disclosure.

FIG. 6 is a schematic structural diagram of a display device according to an embodiment of the present disclosure. As shown in FIG. 6, the display device provided in the embodiment of the present invention further includes other components, such as a second dust-proof part, on the basis of the display device shown in FIG. 3.

As shown in FIG. 6, the display device 1 provided in the embodiment of the present invention may further include:
a second dust-proof part 15, located between the housing 11 and the camera 12.

The display device 1 may include a housing 11, a camera 12, a display component 10, a first dust-proof part 13, and a sealant 14. The first dust-proof part 13 is accommodated in the accommodating groove 112 of the housing 11.

It is understood that the second dust-proof part 15 may also include an annular structure. As shown in FIG. 6, the second dust-proof part 15 can be adhered to the housing 11. At this time, the second dust-proof part 15 is in a compressed state, thereby sealing the gap between the housing and the camera to prevent dust from entering.

It should be understood that the thickness of the second dust-proof part 15 and the length in the direction of the housing 11 toward the first opening 111 can be set according to the actual application, and the embodiment of the present disclosure is not limited.

The present disclosure provides a display device, which can seal the gap between the housing and the camera by setting a second dust-proof part between the housing and the camera on the basis of setting a first dust-proof part between the display component and the housing, so as to further ensure that there is no dust entering in the first opening and the second opening.

Figure 7:
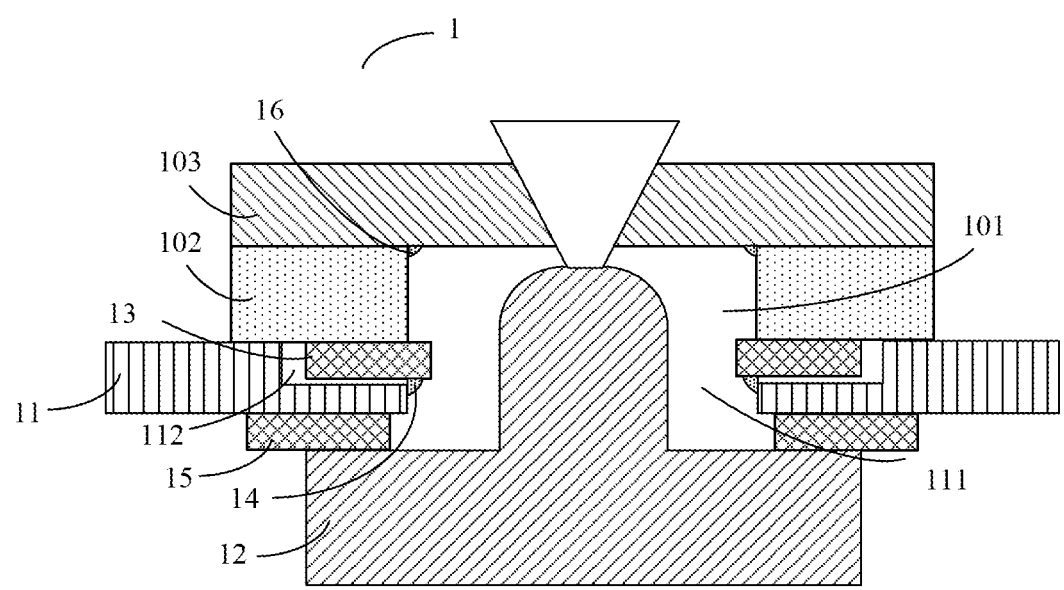
FIG. 7 is a schematic structural diagram of a display device according to an embodiment of the present disclosure.

FIG. 7 is a schematic structural diagram of a display device according to an embodiment of the present disclosure. As shown in FIG. 7, in the display device provided in the embodiment of the present disclosure, the display component 10 can be further subdivided on the basis of the display device shown in FIG. 6. For example, the display component 10 may include a backlight part 102 and a glass cover plate 103.

As shown in FIG. 7, the display device 1 provided in the embodiment of the present disclosure may include a backlight part 102, a glass cover plate 103, a first dust-proof part 13, a sealant 14, a light blocking adhesive 16, a housing 11, a camera 12, a second dust-proof part 15, a first opening 111 of the housing 11, and a second opening 101 of the display component 10.

The surface of the housing 11 toward the first dust-proof part 13 is recessed inwardly to form an accommodating groove 112, and the first dust-proof part 13 can be accommodated in the accommodating groove 112 of the housing 11.

The backlight part 102 in the display component 10 is provided with a second opening 101 penetrating the backlight part 102 in the thickness direction for accommodating the camera 12. The glass cover plate 103 is provided with no opening. In order to ensure that the backlight part 102 and the glass cover plate 103 are firmly adhered at the edge area of the second opening 101 and there is no light penetrating through, light blocking adhesive 16 is applied at the edge area of the second opening 101, that is, at the junction of the backlight part 102 and the glass cover plate 103 in the second opening 101, to prevent the light in the display component from penetrating into the camera 12 and affecting the imaging of the camera 12. The light blocking adhesive 16 can be formed by a dispensing process.

The present disclosure provides a display device. On the basis of setting a first dust-proof part between the display component and the housing and a second dust-proof part between the housing and the camera, the gap between the first dust-proof part and the housing can be sealed by setting a sealant, which can further ensure that the gap between the display component and the housing will not have dust entering. At the same time, the first dust-proof part can be accommodated in the accommodating groove, which can reduce the situation that the first dust-proof part is pressed by the display component when the housing supports the display component, reduce the reverse force acting on the display component due to the pressing of the first dust-proof part, and further reduce the pressing water ripples generated by the display component.

Figure 8:
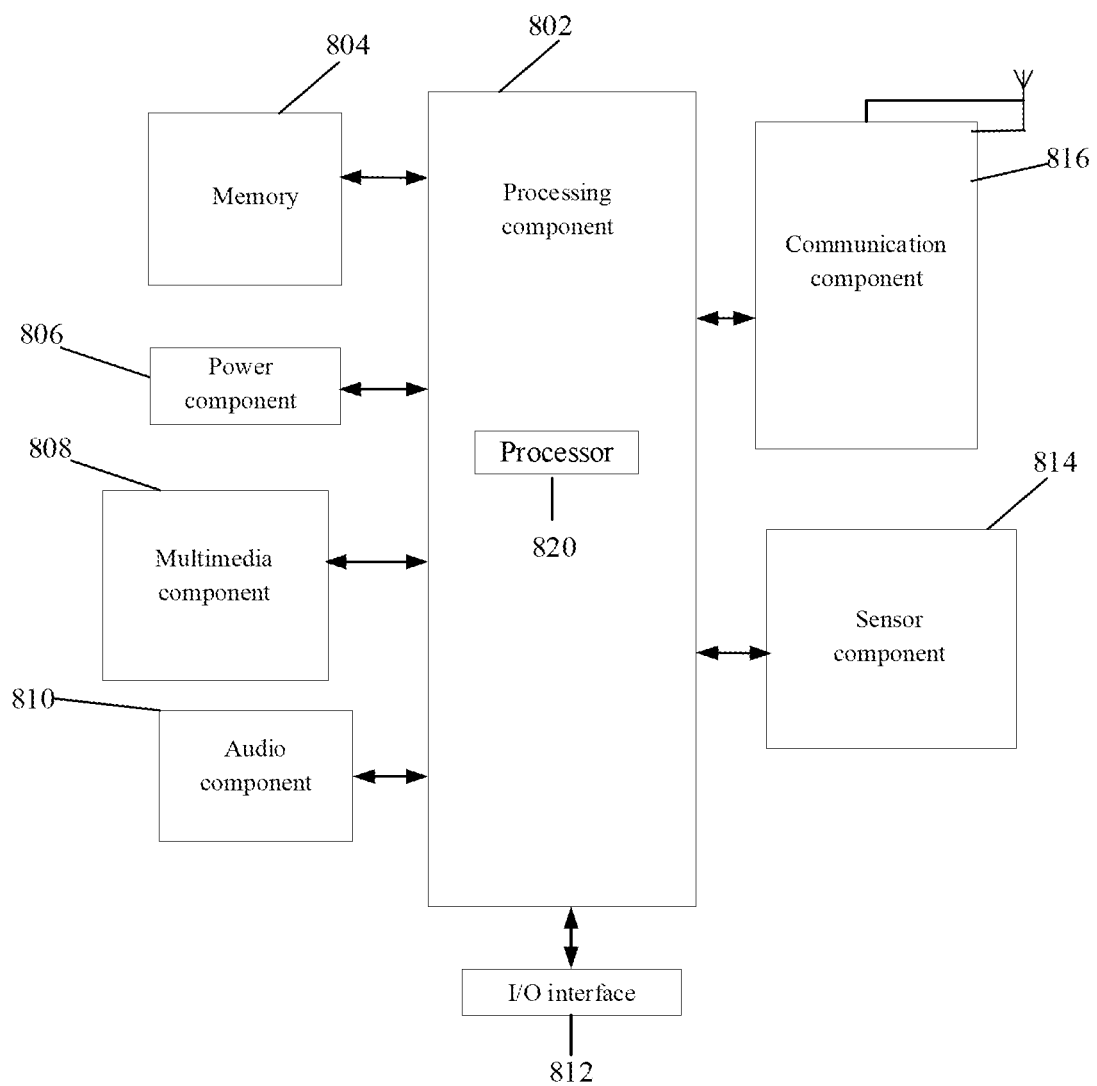
FIG. 8 is a structural block diagram of a display device according to an embodiment of the present disclosure.

FIG. 8 is a structural block diagram of a display device according to an embodiment of the present disclosure. For example, the display device 800 may be a mobile phone, a computer, a digital broadcasting terminal, a messaging device, a game console, a tablet device, a medical device, a fitness device, a personal digital assistant, and the like.

Referring to FIG. 8, the display device 800 may include one or more of the following components: a processing component 802, a memory 804, a power component 806, a multimedia component 808, an audio component 810, an input/output (I/O) interface 812, a sensor component 814, and a communication component 816.

The processing component 802 generally controls the overall operation of the display device 800, such as operations associated with display, telephone call, data communication, camera operation, and recording operation. The processing component 802 may include one or more processors 820 to execute instructions. In addition, the processing component 802 may include one or more modules to facilitate interaction between the processing component 802 and other components. For example, the processing component 802 may include a multimedia module to facilitate interaction between the multimedia component 808 and the processing component 802.

The memory 804 is configured to store various types of data to support operations at the device 800. Examples of such data include instructions for any application or method operating on the display device 800, contact data, phonebook data, messages, pictures, videos, and the like. The memory 804 may be implemented by any type of volatile or nonvolatile storage device or a combination of which, such as static random access memory (SRAM), electrically erasable programmable read only memory (EEPROM), erasable programmable read only memory (EPROM), programmable read only memory (PROM), read only memory (ROM), magnetic memory, flash memory, magnetic disk or optical disk.

The power component 806 provides power to various components of the display device 800. The power component 806 may include a power management system, one or more power supplies, and other components associated with generating, managing, and distributing power to the display device 800.

The multimedia component 808 includes a screen that provides an output interface between the display device 800 and the user. In some embodiments, the screen may include a liquid crystal display (LCD) and a touch panel (TP). If the screen includes a touch panel, the screen may be implemented as a touch screen to receive an input signal from a user. The touch panel includes one or more touch sensors to sense touch, sliding and gestures on the touch panel. The touch sensor may sense the boundary of the touch or slide action, and detect the duration and pressure related to the touch or slide operation. In some embodiments, the multimedia component 808 includes a front camera and/or a rear camera. When the device 800 is in an operation mode, such as a shooting mode or a video mode, the front camera and/or the rear camera may receive external multimedia data. Each front camera and rear camera may be a fixed optical lens system or have focal length and optical zoom capability.

The audio component 810 is configured to output and/or input audio signals. For example, the audio component 810 includes a microphone (MIC) configured to receive external audio signals when the display device 800 is in an operation mode, such as a call mode, a recording mode, and a voice recognition mode. The received audio signals may be further stored in the memory 804 or transmitted via the communication component 816. In some embodiments, the audio component 810 further includes a speaker for outputting audio signals.

The I/O interface 812 provides an interface between the processing component 802 and a peripheral interface module, which may be a keyboard, a click wheel, a button, etc. These buttons may include, but are not limited to, a home button, a volume button, a start button, and a lock button.

The sensor component 814 includes one or more sensors for providing various aspects of the status evaluation for the display device 800. For example, the sensor component 814 can detect the opening/closing state of the device 800, the relative positioning of the components, such as the display and keypad of the display device 800. The sensor component 814 can also detect the position change of the display device 800 or a component of the display device 800, the presence or absence of the user's contact with the display device 800, the orientation or acceleration/deceleration of the display device 800, and the temperature change of the display device 800. The sensor component 814 may include a proximity sensor configured to detect the presence of nearby objects in the absence of any physical contact. The sensor component 814 may also include a light sensor, such as a CMOS or CCD image sensor, for using in imaging applications. In some embodiments, the sensor component 814 may also include an acceleration sensor, a gyro sensor, a magnetic sensor, a pressure sensor, or a temperature sensor.

The communication component 816 is configured to facilitate wired or wireless communication between the display device 800 and other devices. The display device 800 may access a wireless network based on a communication standard, such as WiFi, 2G or 3G, or their combination. In some embodiments, the communication component 816 receives broadcast signals or broadcast related information from an external broadcast management system via a broadcast channel. In some embodiments, the communication component 816 further includes a near field communication (NFC) module to facilitate short-range communication. For example, the NFC module can be implemented based on radio frequency identification (RFID) technology, infrared data association (IrDA) technology, ultra wideband (UWB) technology, bluetooth (BT) technology and other technologies.

In some embodiments, the display device 800 may be implemented by one or more application specific integrated circuits (ASIC), digital signal processors (DSP), digital signal processing devices (DSPD), programmable logic devices (PLD), field programmable gate arrays (FPGA), controllers, microcontrollers, microprocessors, or other electronic components.

It should also be noted that the terms "including", "containing" or any other variation thereof are intended to cover non-exclusive inclusion, so that a process, method, commodity or equipment including a series of elements includes those elements, and other elements not explicitly listed, or elements inherent to such a process, method, commodity or equipment. Without further limitation, the element defined by the sentence "including one . . . " does not exclude the existence of another identical element in the process, method, commodity or equipment including the element.

Those skilled in the art will easily think of other embodiments of the present disclosure after considering the description and practicing the present disclosure disclosed here. The present disclosure is intended to cover any variation, use or adaptive change of the present disclosure. These variations, uses or adaptive changes follow the general principles of the present disclosure and include the common knowledge or customary technical means in the technical field not disclosed in the present disclosure. The description and the embodiments are considered as exemplary, and the true scope and spirit of the present disclosure are indicated by the following claims.

It should be understood that the present invention is not limited to the precise structure described above and shown in the drawings, and various modifications and changes can be made without departing from its scope. The scope of the present disclosure is limited by the appended claims.

In order to overcome the problems existing in the related art, the present disclosure provides a display device.

According to a first aspect of embodiments of the present disclosure, there is provided a display device including at least of the following a housing including a first opening, a display component, mounted on the housing and including a second opening aligned with the first opening, where the first opening and the second opening are used for a camera of the display device to collect ambient light. The display deice can further include a first dust-proof part, located between the display component and the housing, where, a surface of the housing toward the first dust-proof part is recessed inwardly to form an accommodating groove used for accommodating the first dust-proof part.

In some embodiments, a thickness of the first dust-proof part is less than or equal to a depth of the accommodating groove.

In some embodiments, the display device further includes:
a sealant, located between the first dust-proof part and the housing, for sealing a gap between the first dust-proof part and the housing.

In some embodiments, the accommodating groove communicates with the first opening, the first dust-proof part includes an extension portion extending toward the first opening and located outside the accommodating groove, and the sealant is located in a space enclosed by the extension portion and the housing, and connects a surface of the extension portion toward the first opening and an inner wall of the first opening.

In some embodiments, the sealant is a hot melt adhesive.

In some embodiments, the accommodating groove is spaced apart from the first opening, where the sealant is located on a surface of the first dust-proof part contacting with the accommodating groove.

In some embodiments, the sealant is a dispensed adhesive.

In some embodiments, a length of the sealant in a direction of the housing toward the first opening ranges from 0.5 mm to 1 mm.

In some embodiments, the first dust-proof part includes an annular structure, and the first dust-proof part is adhered to the display component.

In some embodiments, the display device further includes a second dust-proof part, located between the housing and the camera.

The technical solution provided by the embodiments of the present disclosure may include the following beneficial effects:

According to embodiments of the present disclosure, there is provided a display device. The display device includes: a housing including a first opening; a display component mounted on the housing and including a second opening aligned with the first opening, where the first opening and the second opening are used for the camera of the display device to collect ambient light; a first dust-proof part located between the display component and the housing; where the surface of the housing toward the first dust-proof part is recessed inwardly to form an accommodating groove used for accommodating the first dust-proof part. Thus, by accommodating the first dust-proof part in the accommodating groove, it is possible to reduce the situation that the first dust-proof part is pressed by the display component when the housing supports the display component, reduce the reverse force acting on the display component due to the pressing of the first dust-proof part, and further reduce the pressing water ripples generated by the display component.

It should be understood that the above general description and the following detailed description are exemplary and explanatory, and do not limit the present disclosure.

The invention claimed is:
1. A display device comprising:
a housing, comprising a first opening;
a display component, mounted on the housing and comprising a second opening aligned with the first opening;
wherein the first opening and the second opening are used for a camera of the display device to collect ambient light;
a first dust-proof part, located between the display component and the housing; and
a sealant, located between the first dust-proof part and the housing and used for sealing a gap between the first dust-proof part and the housing;
wherein, a surface of the housing toward the first dust-proof part is recessed inwardly to form an accommodating groove used for accommodating the first dust-proof part.

2. The display device according to claim 1, wherein a thickness of the first dust-proof part is less than or equal to a depth of the accommodating groove.

3. The display device according to claim 1, wherein the accommodating groove communicates with the first opening;
the first dust-proof part comprises an extension portion extending toward the first opening and located outside the accommodating groove; and
the sealant is located in a space enclosed by the extension portion and the housing, and connects a surface of the extension portion toward the first opening and an inner wall of the first opening.

4. The display device according to claim 3, wherein the sealant is a hot melt adhesive.

5. The display device according to claim 4, wherein the sealant is formed by a dispensing process.

6. The display device according to claim 1, wherein the accommodating groove is spaced apart from the first opening; and
the sealant is located on a surface of the first dust-proof part contacting with the accommodating groove.

7. The display device according to claim 6, wherein a length of the first dust-proof part in a direction of the housing toward the first opening is less than or equal to a width of the accommodating groove.

8. The display device according to claim 6, wherein the sealant is a dispensed adhesive.

9. The display device according to claim 1, wherein a length of the sealant in a direction of the housing toward the first opening ranges from 0.5 mm to 1 mm.

10. The display device according to claim 1, wherein, the first dust-proof part comprises an annular structure, and the first dust-proof part is adhered to the display component.

11. The display device according to claim 1, further comprising:
a second dust-proof part, located between the housing and the camera.

12. The display device according to claim 11, wherein the second dust-proof part comprises an annular structure, and the second dust-proof part is adhered to the housing.

13. The display device according to claim 1, wherein the display component comprises:
a glass cover plate; and
a backlight part, adhered to the glass cover plate.

14. The display device according to claim 13, wherein the backlight part is provided with the second opening penetrating the backlight part in a thickness direction.

15. The display device according to claim 14, wherein the backlight part is adhered to the glass cover plate at an edge area of the second opening.

16. The display device according to claim 15, wherein a light blocking adhesive is applied at a junction of the backlight part and the glass cover plate in the second opening.

17. The display device according to claim 16, wherein the light blocking adhesive is formed by a dispensing process.

18. The display device according to claim 1, wherein the first dust-proof part is an elastic part.

19. The display device according to claim 1, wherein a shape of the accommodating groove is matched with a shape of the first dust-proof part.

* * * * *